United States Patent
Cavus et al.

(10) Patent No.: US 9,712,158 B1
(45) Date of Patent: Jul. 18, 2017

(54) APPARATUS AND METHODS FOR BIASING RADIO FREQUENCY SWITCHES

(71) Applicant: ANALOG DEVICES GLOBAL, Hamilton (BM)

(72) Inventors: Bilal Tarik Cavus, Istanbul (TR); Ozgun Serttek, Istanbul (TR)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/092,975

(22) Filed: Apr. 7, 2016

(51) Int. Cl.
*H03K 17/687* (2006.01)
*H03K 17/06* (2006.01)

(52) U.S. Cl.
CPC ......... *H03K 17/687* (2013.01); *H03K 17/063* (2013.01); *H03K 17/6871* (2013.01)

(58) Field of Classification Search
CPC ............. H03K 17/687; H03K 17/6871; H03K 17/6877; H04B 1/44; H04B 1/48
See application file for complete search history.

(56) References Cited

U.S. PATENT DOCUMENTS

| | | | |
|---|---|---|---|
| 4,952,818 A | 8/1990 | Erdelyi et al. | |
| 5,878,331 A | 3/1999 | Yamamoto et al. | |
| 6,177,817 B1 | 1/2001 | Fifield et al. | |
| 6,804,502 B2 | 10/2004 | Burgener et al. | |
| 6,970,024 B1 | 11/2005 | Reese et al. | |
| 7,263,337 B2 * | 8/2007 | Struble | H03K 17/063 333/101 |
| 7,613,442 B1 | 11/2009 | Kelly et al. | |
| 8,159,282 B2 * | 4/2012 | Katoh | H03K 17/063 327/427 |
| 8,368,462 B2 | 2/2013 | Sharma et al. | |
| 8,373,490 B2 | 2/2013 | Burgener et al. | |
| 8,400,205 B2 | 3/2013 | Foroudi | |
| 8,421,438 B2 | 4/2013 | Pratt et al. | |
| 8,493,128 B2 | 7/2013 | Adamski | |
| 8,514,008 B2 * | 8/2013 | Yan | H03K 17/063 327/387 |

(Continued)

FOREIGN PATENT DOCUMENTS

WO    WO 2014047823 A1    4/2014

OTHER PUBLICATIONS

Peregrine Semiconductor, PE42020 Product Specification: UltraCMOS® True DC RF Switch, Dec. 2014, 25 pages, available at: www.psemi.com/pdf/datasheets/pe42020ds.pdf (accessed Nov. 2, 2015).

*Primary Examiner* — Patrick O'Neill
(74) *Attorney, Agent, or Firm* — Knobbe Martens Olson & Bear LLP

(57) ABSTRACT

Apparatus and methods for biasing radio frequency (RF) switches are provided herein. In certain configurations, an RF switching circuit includes a field effect transistor (FET) switch electrically connected between a first terminal and a second terminal, and an adaptive biasing circuit that generates a bias voltage used in part to bias a gate of the FET switch. The adaptive biasing circuit includes a low pass filter that generates a low pass filtered voltage based on low pass filtering a voltage of the first terminal, a buffer circuit that receives the low pass filtered voltage and generates a buffered voltage, and a voltage shifting circuit that generates the bias voltage by shifting the buffered voltage by an amount of voltage that depends on a state of a switch control signal.

20 Claims, 8 Drawing Sheets

(56) References Cited

U.S. PATENT DOCUMENTS

| | | |
|---|---|---|
| 8,547,156 B2 | 10/2013 | Foroudi |
| 8,854,111 B2 | 10/2014 | Chih-Sheng |
| 9,054,726 B2 | 6/2015 | Okuda et al. |
| 9,312,909 B2 * | 4/2016 | Kang .................... H04B 1/525 |
| 9,374,124 B2 | 6/2016 | Kolcuoglu et al. |
| 2002/0075044 A1 | 6/2002 | Hinterscher |
| 2007/0069798 A1 | 3/2007 | Kusachi |
| 2007/0182461 A1 | 8/2007 | Harvey |
| 2011/0254614 A1 | 10/2011 | Huang et al. |
| 2014/0062218 A1 | 3/2014 | Chih-sheng |
| 2014/0062577 A1 | 3/2014 | Chih-sheng |
| 2014/0070976 A1 | 3/2014 | Hurrell et al. |
| 2014/0144240 A1 | 5/2014 | Barlow et al. |
| 2015/0145587 A1 | 5/2015 | Sigetani et al. |

* cited by examiner

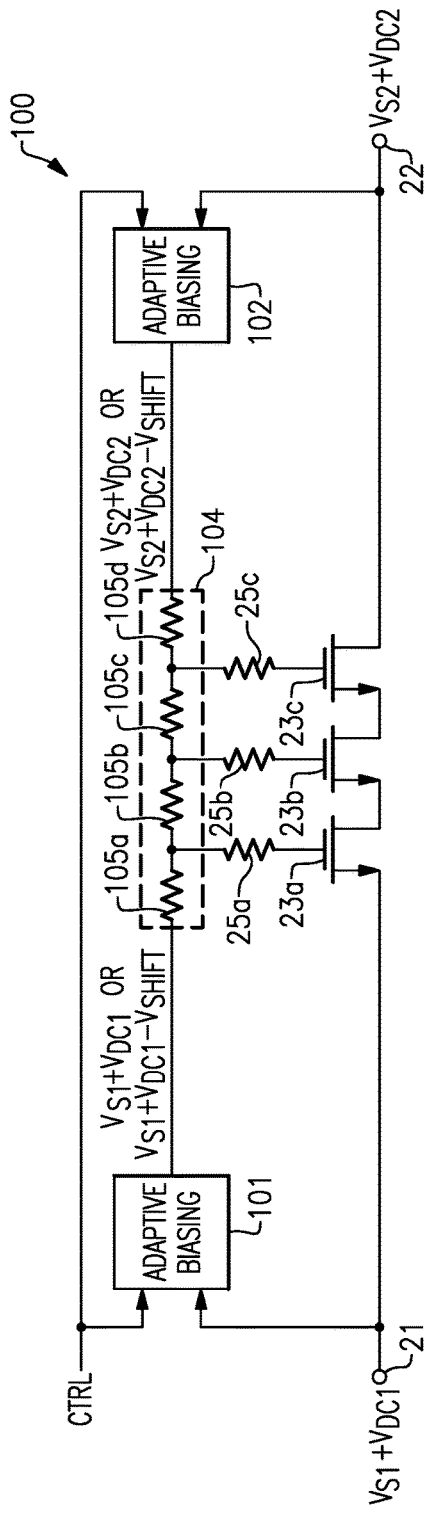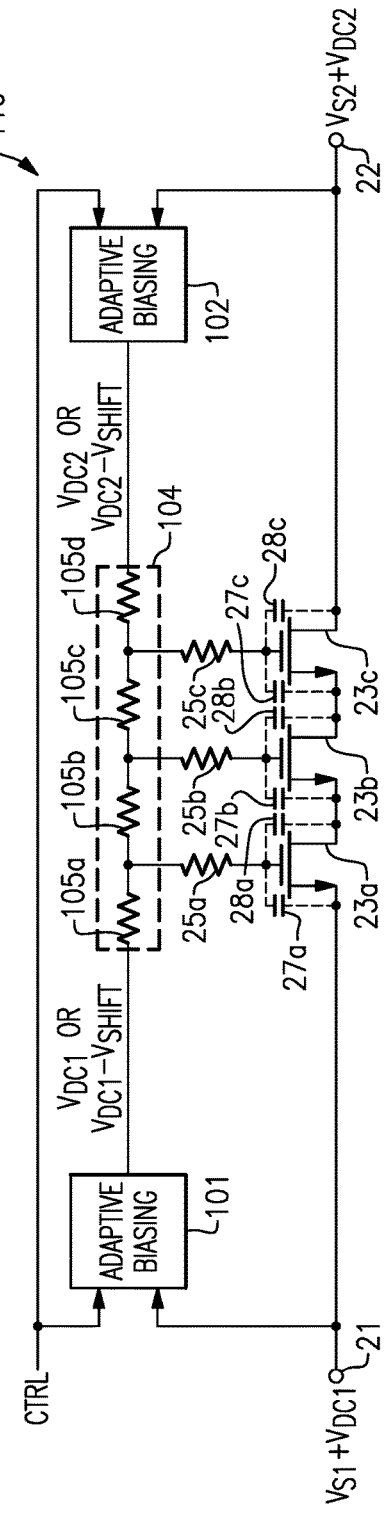

APPARATUS AND METHODS FOR BIASING RADIO FREQUENCY SWITCHES

BACKGROUND

Field

Embodiments of the invention relate to electronic systems, and more particularly, to biasing of radio frequency switches.

Description of the Related Technology

A radio frequency (RF) system can include RF switches used for a variety of purposes.

In one example, an RF system, such as a mobile device or base station, can include an antenna switch module (ASM) implemented using RF switches. Additionally, the ASM can be used to electrically connect an antenna to a particular transmit or receive path of the system, thereby allowing multiple components to access the antenna.

In another example, an RF system can include a digital step attenuator (DSA), and the DSA can include RF switches that are turned on or off to control an amount of attenuation provided by the DSA.

SUMMARY

In one aspect, a radio frequency (RF) switching circuit includes a field effect transistor (FET) switch electrically connected along a signal path, and an adaptive biasing circuit configured to generate a bias voltage used in part to bias a gate of the FET switch. The adaptive biasing circuit includes a low pass filter configured to generate a low pass filtered voltage based on low pass filtering a signal path voltage of a node of the signal path, a buffer circuit configured to receive the low pass filtered voltage and to generate a buffered voltage, and a voltage shifting circuit configured to generate the bias voltage by shifting the buffered voltage by an amount of voltage that changes based on a state of a switch control signal.

In another aspect, an electronically implemented method of switch biasing is provided. The method includes receiving a switch control signal and a voltage of a signal path as inputs to an adaptive biasing circuit, generating a low pass filtered voltage by low pass filtering the voltage of the signal path using the adaptive biasing circuit, generating a buffered voltage based on buffering the low pass filtered voltage using the adaptive biasing circuit, generating a bias voltage using the adaptive biasing circuit by shifting the buffered voltage by an amount of voltage that changes based on a state of the switch control signal, and controlling a gate voltage of a FET switch that is electrically connected along the signal path based in part on the bias voltage.

In another aspect, an RF system is provided. The RF system includes one or more series FET switches electrically connected along a signal path between a first terminal and a second terminal, and a first adaptive biasing circuit configured to generate a first bias voltage. A first series FET switch of the one or more series FET switches is biased in part by the first bias voltage. The first adaptive biasing circuit includes a low pass filter configured to generate a low pass filtered voltage based on low pass filtering a voltage of the first terminal, a buffer circuit configured to receive the low pass filtered voltage and to generate a buffered voltage, and a voltage shifting circuit configured to generate the first bias voltage based on the buffered voltage and a state of a switch control signal.

BRIEF DESCRIPTION OF THE DRAWINGS

FIG. 6A is an annotated circuit diagram at low frequency for one embodiment of an RF switching circuit.

FIG. 6B is an annotated circuit diagram at high frequency for one embodiment of an RF switching circuit.

DETAILED DESCRIPTION OF EMBODIMENTS

Figure 1:
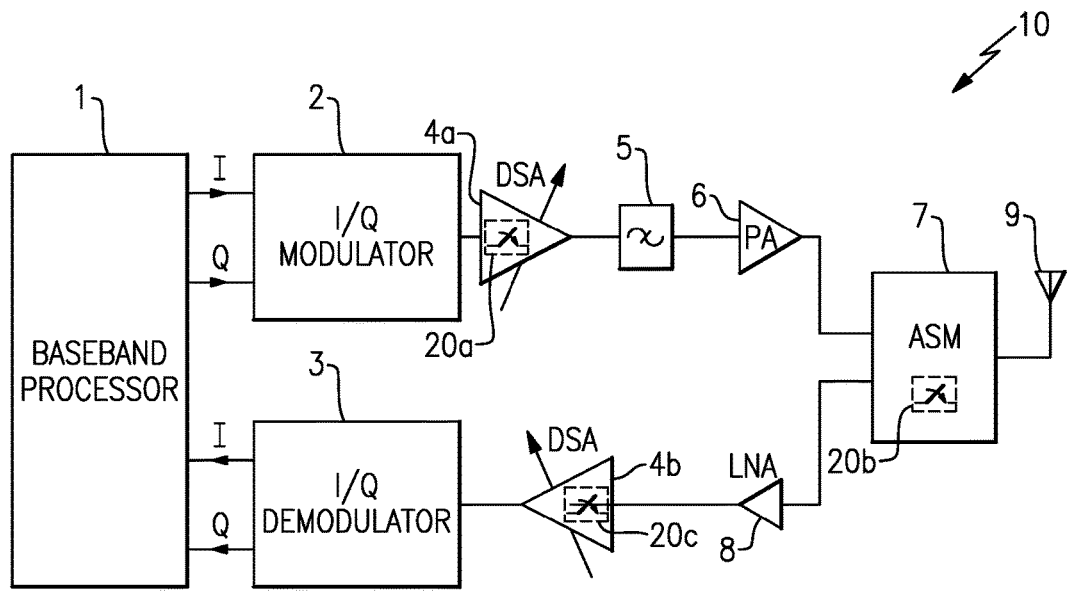
FIG. 1 is a schematic diagram of one example of a radio frequency (RF) system that can include one or more RF switching circuits in accordance with the teachings herein.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A field effect transistor (FET) can be used in a radio frequency (RF) system as a switch. For example, a channel of the FET switch can be electrically connected between a first terminal and a second terminal, and the gate voltage of the FET switch can be controlled to open or close the FET switch.

A gate resistor can be used to bias a gate of a FET switch. For example, a DC bias voltage can be provided to the gate of the FET switch via the gate resistor. The gate resistor provides isolation between the gate of FET switch and bias circuitry used to generate the DC bias voltage.

Including a gate resistor also allows the FET switch's gate bias voltage to dynamically track changes in the signal's voltage amplitude, thereby enhancing performance in the presence of signal swing. For example, a FET switch can include parasitic gate-to-drain and gate-to-source capacitors, which can operate to bootstrap the FET switch's gate in response to changes in the source and drain voltages. Thus, the FET switch can exhibit robust power handling capability for high frequencies signals, since the FET switch's gate voltage can track or change with the signal to maintain proper biasing conditions.

However, a FET switch can exhibit poor power handling capability at lower frequencies. For example, low frequency signal components may not be coupled to the gate via the FET switch's parasitic capacitors, and thus the FET switch's gate voltage may not change with a low frequency signal. Thus, a low frequency signal of high power can cause a FET switch that is biased in the OFF state to turn on during part of the signal cycle and/or cause a FET switch that is biased in the ON state to turn off during part of the signal cycle. Accordingly, a FET switch may not properly function in the presence of low frequency signals of large amplitude, and the power handling capability of a FET switch can be poor at low frequencies.

In certain implementations, a resistance value of the gate resistor can be selected to improve power handling capability at low frequencies. For example, increasing the resistance of the gate resistor decreases an amount of low pass filtering of signal components at the gate of the FET switch, and thus can be used to improve low frequency power handling. Although the power handling capability can be improved by increasing the value of a gate resistor, the maximum practical value of the gate resistor can be limited by a variety of factors. For example, a large gate resistor can occupy a relatively large chip area and/or degrade switching time specifications, such as transient turn-on and/or turn-off performance. Although power handling capability can also be improved by increasing the numbers of transistors in series, the maximum number of series transistors can be constrained by chip area and/or performance specifications.

Accordingly, there is a need for a FET switch that has high power handling capability across a wide frequency range.

Apparatus and methods for biasing RF switches are provided herein. In certain configurations, an RF switching circuit includes a FET switch electrically connected between a first terminal and a second terminal, and an adaptive biasing circuit that generates a bias voltage used in part to bias a gate of the FET switch. The adaptive biasing circuit includes a low pass filter that generates a low pass filtered voltage based on low pass filtering a voltage of the first terminal, a buffer circuit that receives the low pass filtered voltage and generates a buffered voltage, and a voltage shifting circuit that generates the bias voltage by shifting the buffered voltage by an amount of voltage that depends on a state of a switch control signal.

Implementing the RF switching circuit in this manner provides high power handling capability across a wide range of frequencies, including at relatively low frequencies. For example, the buffered voltage generated by the buffer circuit includes a low frequency component of the input signal, and thus the bias voltage tracks low frequency signal components. Additionally, high frequency components of the input signal couple onto the gate of the FET switch via parasitic gate-to-drain and/or gate-to-source capacitances. Thus, the FET switch's gate voltage tracks the input signal across a wide range of frequencies, including both at high frequencies and at low frequencies, which in turn results in excellent power handling capability over a wide frequency range.

To achieve high performance, a FET switch can be manufactured using compound semiconductor technology. For example, FET switches fabricated using III-V processes can exhibit higher linearity, lower insertion loss, and/or superior maximum operating frequency relative to FET switches manufactured using certain Silicon processes, such as a bulk complementary metal oxide semiconductor (CMOS) processes.

In certain implementations, the adaptive biasing circuit and FET switch are integrated on a common compound semiconductor integrated circuit (IC), such as a gallium arsenide (GaAs) die. For example, the adaptive biasing circuit can be implemented using components readily available in a compound semiconductor process, and thus can be included on-chip with the FET switch. In one example, the buffer circuit is implemented using a FET source follower circuit using circuit components available in compound semiconductor processes, such as III-V processes. Implementing the adaptive biasing circuit and FET switch on a common chip provides a more compact switch solution relative to a configuration implemented using separate chips. For example, certain biasing circuits may use components that are unavailable in a compound semiconductor process and/or can be implemented using unduly large or complex circuits, and thus such implementations can use multiple dies. For instance, such a switching system can be implemented using a multi-chip module (MCM) including a bulk CMOS biasing die and a GaAs switching die.

The teachings herein can be used to provide a FET switch with robust power handling performance across a wide range of frequencies, including at a lower end of an operating frequency range. The FET switch can operate with robust power handling across a wide frequency range, while maintaining a relatively fast switching time performance. The FET switch can also exhibit low insertion loss and/or high linearity. The teachings herein can also be used to provide an integrated switching system, in which an adaptive biasing circuit and a FET switch are integrated on a single chip, such as a compound semiconductor IC.

FIG. 1 is a schematic diagram of one example of an RF system 10 that can include one or more RF switching circuits in accordance with the teachings herein.

Although, the RF system 10 illustrates one example of an electronic system that can include RF switching circuits implemented in accordance with the teachings herein, RF switching circuits can be used in other configurations of electronic systems. Additionally, although a particular configuration of components is illustrated in FIG. 1, the RF system 10 can be adapted and modified in a wide variety of ways. For example, the RF system 10 can include more or fewer receive and/or transmit paths. Additionally, the RF system 10 can be modified to include more or fewer components and/or a different arrangement of components, including, for example, a different arrangement of RF switching circuits.

In the illustrated configuration, the RF system 10 includes a baseband processor 1, an I/Q modulator 2, an I/Q demodulator 3, a first digital step attenuator 4a, a second digital step attenuator 4b, a filter 5, a power amplifier 6, an antenna switch module 7, a low noise amplifier 8, and an antenna 9.

As shown in FIG. 1, the baseband processor 1 generates an in-phase (I) transit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a sinusoidal wave or transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal can be digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs that convert the I and Q transmit signals into an analog format, mixers for upconverting the I and Q transit signals to radio frequency, and a signal combiner for combining the upconverted I and Q signals into the modulated RF signal.

The first digital step attenuator 4a receives the modulated RF signal, and attenuates the modulated RF signal to generate an attenuated RF signal. The first digital step attenuator 4a can aid in obtaining a desired gain and/or power level associated with transmission. In the illustrated configuration, the first digital step attenuator 4a includes a first RF switching circuit 20a. The first digital step attenuator 4a illustrates one example of a circuit that can include one or more RF switching circuits in accordance with the teachings herein. For example, the first digital step attenuator 4a can include a cascade of attenuator stages, each of which can be bypassed using an RF switching circuit to aid in providing a digitally adjustable amount of attenuation.

The filter 5 receives the attenuated RF signal from the first digital step attenuator 4a, and provides a filtered RF signal to an input of the power amplifier 6. In certain configurations, the filter 5 can be a bandpass filter that provides band filtering. However, the filter 5 can be a low pass filter, a band pass filter, or a high pass filter, depending on the application.

The power amplifier 6 can amplify the filtered RF signal to generate an amplified RF signal, which is provided to the antenna switch module 7. The antenna switch module 7 is further electrically connected to the antenna 9 and to an input of the low noise amplifier 8. The antenna switch module 7 can be used to selectively connect the antenna 9 to the output of the power amplifier 6 or to the input of the low noise amplifier 8.

In the illustrated configuration, the antenna switch module 7 includes a second RF switching circuit 20b. The antenna switch module 7 illustrates another example of a circuit that can include one or more RF switching circuits in accordance with the teachings here. For example, the antenna switch module 7 can include an RF switching circuit implemented as a single pole multi-throw switch. Although FIG. 1 illustrates a configuration in which the antenna switch module 7 operates as a double pole single throw switch, the antenna switch module 7 can be adapted to include additional poles and/or throws.

The LNA 8 receives an antenna receive signal from the antenna switch module 7, and generates an amplified antenna receive signal that is provided to the second digital step attenuator 4b. The second digital step attenuator 4b can attenuate the amplified antenna receive signal by a digitally-controllable amount of attenuation. As shown in FIG. 1, the second digital step attenuator 4b generates an attenuated receive signal, which is provided to the I/Q demodulator 3. Including the second digital step attenuator 4b can aid in providing the I/Q demodulator 3 with a signal that has a desired amplitude and/or power level. In the illustrated configuration, the second digital step attenuator 4b includes a third RF switching circuit 20c. The second digital step attenuator 4b illustrates another example of a circuit that can include one or more RF switching circuits in accordance with the teachings herein.

The I/Q demodulator 3 can be used to generate the I receive signal and the Q receive signal, as was descried earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF system 10 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, and/or Enhanced Data Rates for GSM Evolution (EDGE), as well as other proprietary and non-proprietary communications standards.

The RF switching circuits described herein can be used to provide switching in a wide range of applications, including, for example, cellular, microwave, very small aperture terminal (VSAT), test equipment, and/or sensor applications. The RF switching circuits can provide switching to signals of a variety of frequencies, including not only those used for cellular communications, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave communication systems.

Figure 2:
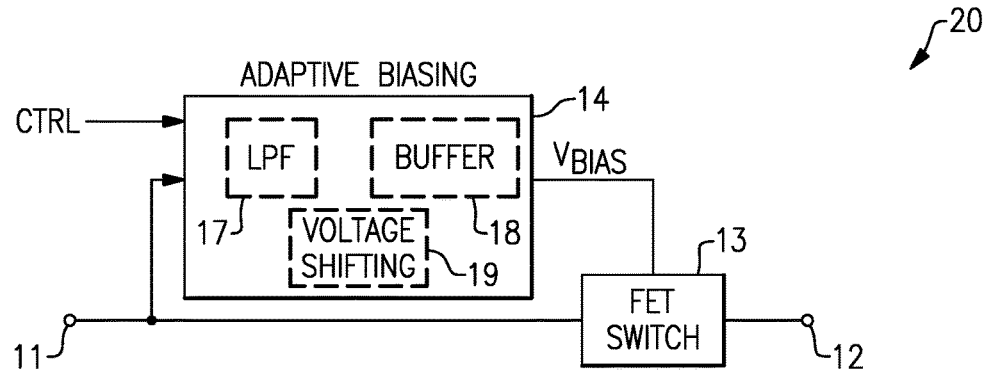
FIG. 2 is a circuit diagram of an RF switching circuit according to one embodiment.

FIG. 2 is a circuit diagram of an RF switching circuit 20 according to one embodiment. The RF switching circuit 20 includes a first terminal 11, a second terminal 12, a FET switch 13, and an adaptive biasing circuit 14. The FET switch 13 is electrically connected between the first terminal 11 and the second terminal 12.

Although FIG. 2 illustrates a configuration including one FET switch, the RF switching circuit 20 can include additional FET switches.

The illustrated adaptive biasing circuit 14 includes a low pass filter 17, a buffer circuit 18, and a voltage shifting circuit 19. As shown in FIG. 2, the adaptive biasing circuit 14 receives a switch control signal CTRL, which is used to control a state of the FET switch 13. Thus, the switch control signal CTRL can be used to open or close the FET switch 13. Additionally, the adaptive biasing circuit 14 receives a voltage of the first terminal 11, and generates a bias voltage $V_{BIAS}$ that biases the FET switch 13.

The adaptive biasing circuit 14 controls the voltage level of the bias voltage $V_{BIAS}$ based on the state of the switch control signal CTRL. For example, when the switch control signal CTRL indicates that the FET switch 13 should be turned on or closed, the adaptive biasing circuit 14 controls a DC voltage component of the bias voltage $V_{BIAS}$ to a first level. Additionally, when the switch control signal CTRL indicates that the FET switch 13 should be turned off or opened, the adaptive biasing circuit 14 controls the DC voltage component of the bias voltage $V_{BIAS}$ to a second level. Additionally, the adaptive biasing circuit 14 generates the bias voltage $V_{BIAS}$ to have an AC voltage component that changes with a low frequency component of a signal received on the first terminal 11.

Adaptively biasing the FET switch 13 in this manner improves power handling capability at low frequency relative to a configuration in which the gate voltage of a FET switch is fixed. For example, when a FET switch operates with a fixed gate voltage, the FET switch may not properly function in the presence of a low frequency signal of high power. For instance, such a signal can cause a FET switch that is biased in the OFF state to turn on during part of the signal cycle and/or cause a FET switch that is biased in the ON state to turn off during part of the signal cycle. In contrast, the adaptively biased FET switch 13 of FIG. 2 has a gate voltage that changes with the signal voltage of the first terminal 11, and thus exhibits enhanced power handling capability.

The low pass filter 17 low pass filters the voltage of the first terminal 11 to generate a low pass filtered voltage. Thus, the low pass filtered voltage can include low frequency signal components at the first terminal 11, but filters high frequency signal components. The buffer circuit 18 receives the low pass filtered voltage from the low pass filter 17 and generates a buffered voltage that includes the low frequency signal components of the first terminal 11. Additionally, the voltage shifting circuit 19 generates the bias voltage $V_{BIAS}$ used to bias the FET switch 13 by shifting the buffered voltage by an amount of voltage that depends on the state of the switch control signal CTRL.

Thus, the bias voltage $V_{BIAS}$ of FIG. 2 has a DC voltage component that changes with the state of the switch control signal CTRL, and an AC voltage component that tracks or changes with a low frequency signal component of the first terminal 11.

The FET switch 13 can be implemented in a variety of ways, including, for example, using depletion mode and/or enhancement mode transistors. Although illustrated as a single transistor, the FET switch 13 can include multiple transistors. For example, connecting multiple FET switches in series can enhance power handling capability. For instance, for a processing technology having FETs with a 2.5V drain-to-source breakdown voltage, eight or more FETs can be connected in series to handle a signal of about 20V peak amplitude.

The first and second terminals 11, 12 can be connected in a wide variety of ways. In one example, the first terminal 11 serves as an input terminal and the second terminal 12 serves as an output terminal. In another example, the first terminal 11 serves as an output terminal and the second terminal 12 serves as an input terminal. In yet another example, the RF switching circuit 20 is connected in shunt, and the first terminal 11 is connected to a signal path and the second terminal 12 is connected to a DC voltage, such as ground.

The RF switching circuit 20 can be used in a wide variety of configurations within an electronic system. For example, the FET switch 13 can connected along or in shunt to a signal path of an RF system, such as the RF system 10 of FIG. 1.

Additional details of the RF switching circuit 20 can be similar to those described earlier.

Figure 3:
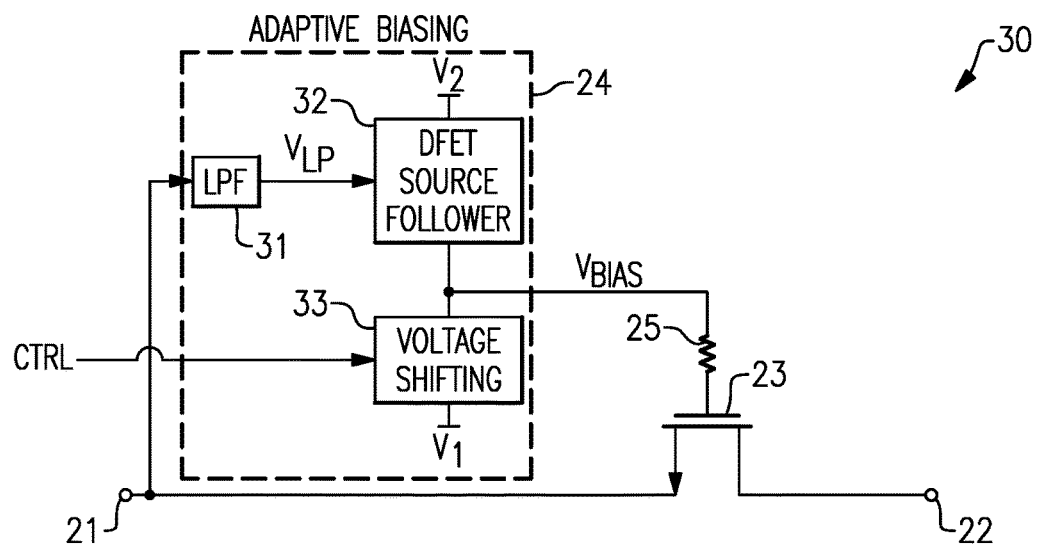
FIG. 3 is a circuit diagram of an RF switching circuit according to another embodiment.

FIG. 3 is a circuit diagram of an RF switching circuit 30 according to another embodiment. The RF switching circuit 30 includes a first terminal 21, a second terminal 22, a depletion mode field effect transistor (DFET) switch 23, an adaptive biasing circuit 24, and a gate resistor 25. The DFET switch 23 is electrically connected between the first terminal 21 and the second terminal 22.

Although FIG. 3 illustrates a configuration including one DFET switch, the RF switching circuit 30 can be implemented in other ways, such as configurations using additional DFET switches and/or other components.

The illustrated DFET switch 23 is a depletion mode or normally on transistor having a threshold voltage that is less than or equal to about 0 V. The DFET switch 23 can be implemented in a variety of ways.

In one embodiment, the DFET switch 23 is implemented using a compound semiconductor technology. For example, the DFET switch 23 can be implemented as a metal semiconductor field effect transistor (MESFET). In certain implementations, the DFET switch 23 is a high electron mobility transistor (HEMT), such as a gallium arsenide (GaAs) HEMT, indium phosphide (InP) HEMT, or gallium nitride (GaN) HEMT.

In one embodiment, the DFET switch 23 is implemented using a complementary metal oxide semiconductor (CMOS), such as a silicon on insulator (SOI) process. In such configurations the DFET switch 23 is a metal oxide semiconductor (MOS) transistor having a threshold voltage that is less than or equal to about 0V. As used herein and as persons having ordinary skill in the art will appreciate, MOS transistors can also have gates made out of materials that are not metals, such as poly silicon, and can have dielectric regions implemented not just with silicon oxide, but with other dielectrics, such as high-k dielectrics.

Although FIG. 3 illustrates a configuration using n-type transistors, the teachings herein are applicable to configurations using p-type transistors or a combination of n-type and p-type transistors.

The illustrated adaptive biasing circuit 24 includes a low pass filter 31, a DFET source follower circuit 32, and a voltage shifting circuit 33. The low pass filter 31 generates a low pass filtered voltage $V_{LP}$ by low pass filtering the voltage of the first terminal 21. Thus, the low pass filtered voltage $V_{LP}$ includes low frequency signal components of the first terminal 21. The low pass filter 31 can be implemented in a variety of ways, and can include, for example, a resistor-capacitor (RC) filter.

The DFET source follower circuit 32 receives the low pass filtered voltage $V_{LP}$ and generates a buffered voltage that includes low frequency signal components of the first terminal 21. Additionally, the voltage shifting circuit 33 controls a voltage shift at the output of the DFET source follower circuit 32. The amount of voltage shift provided by the voltage shifting circuit 33 changes based on a state of the switch control signal CTRL. Thus, the DC voltage component of the bias voltage $V_{BIAS}$ changes based on the state of the switch control signal CTRL. Additionally, an AC voltage component of the bias voltage $V_{BIAS}$ changes based on low frequency signal components of the first terminal 21. The DFET source follower circuit 32 illustrates one embodiment of a buffer circuit that can be used in an adaptive biasing circuit. However, an adaptive biasing circuit can use other implementations of buffer circuits.

In the illustrated embodiment, the adaptive biasing circuit 24 is powered using a first voltage $V_1$ and a second voltage $V_2$. In certain configurations, the first voltage $V_1$ is a ground or power low supply voltage, and the second voltage $V_2$ is a power high supply voltage. However, other implementations are possible.

The bias voltage $V_{BIAS}$ is provided from an output of the adaptive biasing circuit 24 to the gate of the DFET switch 23 via the gate resistor 25. In one embodiment, the gate resistor 25 has a resistance in the range of 5Ω to 1 MΩ. However, the gate resistor 25 can have other resistance values, such as a resistance that depends on performance specifications and/or FET implementation.

Figure 4A:
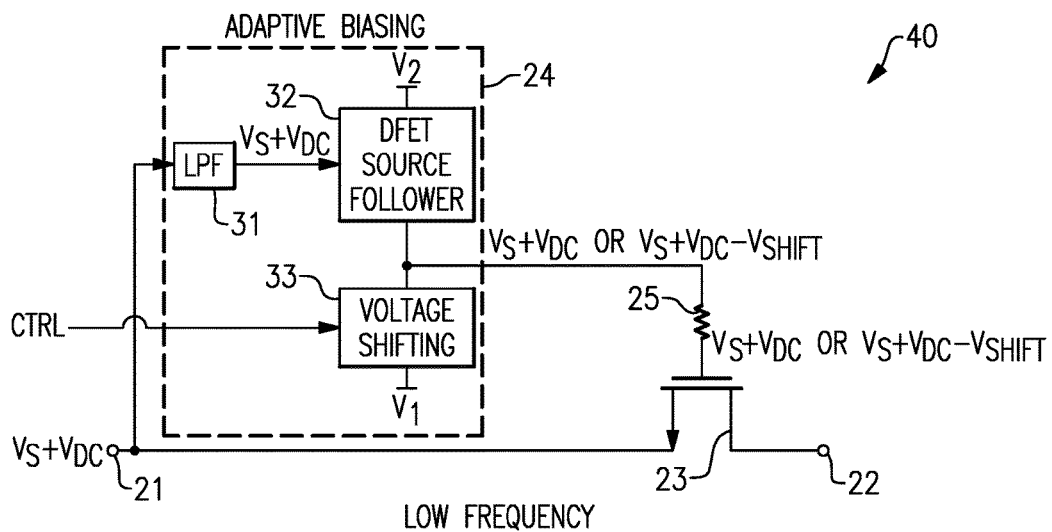
FIG. 4A is an annotated circuit diagram at low frequency for one implementation of the RF switching circuit of FIG. 3.

FIG. 4A is an annotated circuit diagram 40 at low frequency for one implementation of the RF switching circuit 30 of FIG. 3. The annotated circuit diagram 40 includes the first terminal 21, the second terminal 22, the DFET switch 23, the adaptive biasing circuit 24, and the gate resistor 25, which can be as described earlier.

As shown in FIG. 4A, the first terminal 21 has been annotated to receive a voltage corresponding to a sum of a signal voltage $V_S$ and a DC voltage $V_{DC}$. In the illustrated example, the signal voltage $V_S$ is of low frequency, and thus is passed by the low pass filter 31. Accordingly, the low pass filter 31 generates a low pass filtered voltage that is about equal to $V_S+V_{DC}$.

The DFET source follower circuit 32 receives the low pass filtered voltage. Additionally, the voltage shifting circuit 33 controls an amount of voltage shifting at the output of the DFET source follower circuit 32.

When the switch control signal CTRL indicates that the DFET switch 23 should be turned on, the voltage shifting circuit 33 controls the DFET source follower circuit 32 to generate the bias voltage to be about equal to $V_S+V_{DC}$. Since the DFET switch 23 is a normally on transistor, biasing the DFET switch 23 in this manner provides a low impedance path between the first terminal 21 and the second terminal 22. However, when the switch control signal CTRL indicates that the DFET switch 23 should be turned off, the voltage shifting circuit 33 controls the DFET source follower circuit 32 to generate the bias voltage to be about equal to $V_S+V_{DC}-V_{SHIFT}$. The shift voltage $V_{SHIFT}$ is sufficiently large to turn off the DFET switch 23 and provide high impedance between the first terminal 21 and the second terminal 22.

In one embodiment, the shift voltage $V_{SHIFT}$ is selected to be in the range of 1.5 V to about 4 V. In another embodiment, the shift voltage $V_{SHIFT}$ is selected to be at least 300 mV greater than the absolute value of the threshold voltage of the DFET switch 23. However, other values of the shift voltage $V_{SHIFT}$ can be used, such as voltage values that depend on application, implementation, and/or process technology.

Accordingly, the adaptive biasing circuit 24 controls the bias voltage of the DFET switch 23 based on the state of the switch control signal CTRL to turn on or off the DFET switch 23. As shown in FIG. 4A, the bias voltage from the adaptive biasing circuit 24 is provided to the gate of the DFET switch 23 via the gate resistor 25.

The gate voltage of the DFET switch 23 is adaptively biased to track a signal component at the first terminal 21. Thus, when a low frequency signal of high power is received at the first terminal 21, the DFET switch's gate voltage dynamically changes over the signal cycle to track the signal's voltage amplitude. Accordingly, proper biasing of the DFET switch 23 is maintained through the signal cycle, and the DFET switch 23 has robust power handling at low frequencies.

Figure 4B:
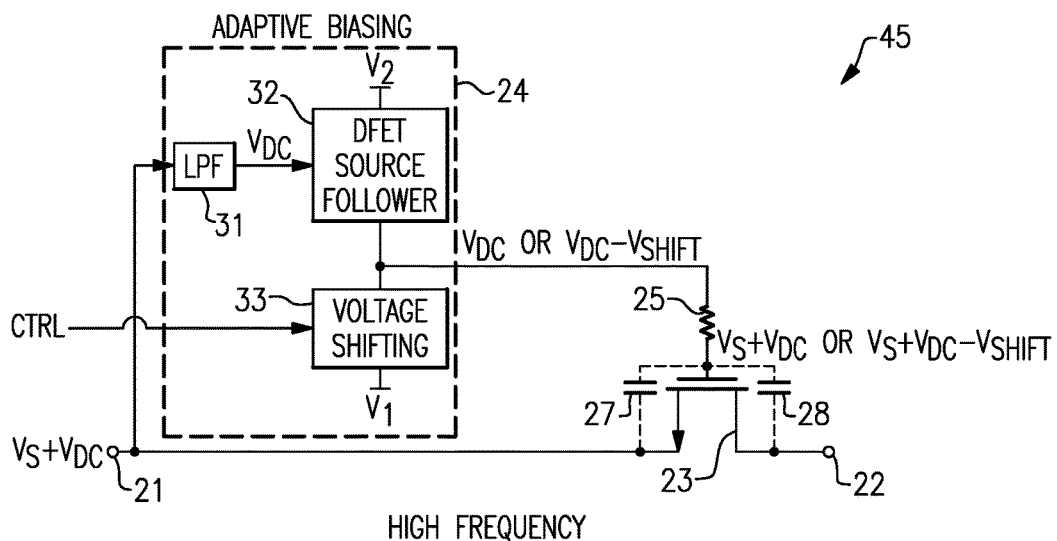
FIG. 4B is an annotated circuit diagram at high frequency for one implementation of the RF switching circuit of FIG. 3.

FIG. 4B is an annotated circuit diagram 45 at high frequency for one implementation of the RF switching circuit 30 of FIG. 3. The annotated circuit diagram 45 includes the first terminal 21, the second terminal 22, the DFET switch 23, the adaptive biasing circuit 24, and the gate resistor 25, which can be as described earlier.

As shown in FIG. 4B, the first terminal 21 has been annotated to receive a voltage corresponding to a sum of a signal voltage $V_S$ and a DC voltage $V_{DC}$. In the illustrated example, the signal voltage $V_S$ is of high frequency, and thus is blocked by the low pass filter 31. Accordingly, the low pass filter 31 generates a low pass filtered voltage that is about equal to $V_{DC}$.

The DFET source follower circuit 32 receives the low pass filtered voltage. Additionally, the voltage shifting circuit 33 controls an amount of voltage shifting at the output of the DFET source follower circuit 32 based on the state of the switch control signal CTRL.

When the switch control signal CTRL indicates that the DFET switch 23 should be turned on, the voltage shifting circuit 33 controls the DFET source follower circuit 32 to generate the bias voltage to be about equal to $V_{DC}$. However, when the switch control signal CTRL indicates that the DFET switch 23 should be turned off, the voltage shifting circuit 33 controls the DFET source follower circuit 32 to generate the bias voltage to be about equal to $V_{DC}-V_{SHIFT}$. The shift voltage $V_{SHIFT}$ is sufficiently large to turn off the DFET switch 23 and provide high impedance between the first terminal 21 and the second terminal 22.

As shown in FIG. 4B, the bias voltage from the adaptive biasing circuit 24 is provided to the gate of the DFET switch 23 via the gate resistor 25. The gate resistor 25 provides isolation from the adaptive biasing circuit 24 and the gate of the DFET switch 23. The illustrated DFET switch 23 has been annotated to include a parasitic gate-to-source capacitor 27 and a parasitic gate-to-drain capacitor 28. The signal voltage $V_S$, which is high frequency in this example, couples onto the gate of the DFET switch 23 via the parasitic capacitors 27, 28.

With reference to FIGS. 4A and 4B, the gate voltage of the DFET switch 23 is controlled to about the same voltage level when processing both low frequency signals and high frequency signals. For example, the high frequency signal components are provided to the DFET switch's gate via coupling by parasitic capacitors, while low frequency signal components are provided to the DFET switch's gate via the adaptive biasing circuit 24.

Accordingly, the illustrated RF switching circuit can operate across a wide range of signal frequencies. The RF switching circuit can have excellent power handling capability across an operating frequency range, including at both low and high frequencies.

Additional details of the RF switching circuit of FIGS. 4A and 4B can be similar to those described earlier.

Figure 5A:
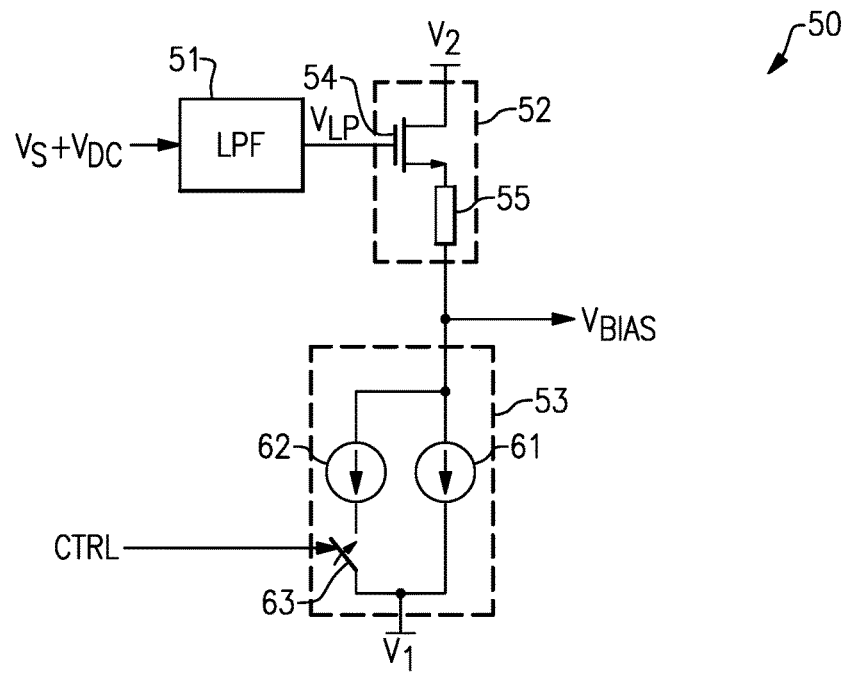
FIG. 5A is an adaptive biasing circuit according to one embodiment.

FIG. 5A is an adaptive biasing circuit 50 according to one embodiment. The adaptive biasing circuit 50 includes a low pass filter 51, a FET source follower circuit 52, and a voltage shifting circuit 53. The FET source follower circuit 52 includes an n-type field effect transistor (NFET) 54 and an impedance 55. The voltage shifting circuit 53 includes a first current source 61, a second current source 62, and a switch 63.

The adaptive biasing circuit 50 of FIG. 5A illustrates one embodiment of an adaptive biasing circuit implemented in accordance with the teachings herein. However, other configurations of adaptive biasing circuits can be used.

As shown in FIG. 5A, the low pass filter 51 receives a signal path voltage. The signal path voltage includes a DC voltage component $V_{DC}$ and an AC signal component $V_S$. The low pass filter 51 filters the signal path voltage to generate a low pass filtered voltage $V_{LP}$ for the gate of the NFET 54. The low pass filtered voltage $V_{LP}$ filters or removes high frequency content of the AC signal component $V_S$, but passes low frequency content. The NFET 54 includes a drain electrically connected to the second voltage $V_2$ and a source electrically to a first end of the impedance 55. Since the NFET 54 is electrically connected in a source follower configuration, the source voltage of the NFET 54 is about equal to the gate voltage of the NFET 54 minus the NFET's threshold voltage.

Thus, the source of the NFET 54 generates a buffered voltage that changes in relation to the low pass filtered voltage $V_{LP}$ generated by the low pass filter 51. The FET source follower circuit 52 illustrates one embodiment of a buffer circuit that can be used in an adaptive biasing circuit. However, an adaptive biasing circuit can use other implementations of buffer circuits.

The illustrated voltage shifting circuit 53 is electrically connected to a second end of the impedance 55, and controls a bias current of the FET source follower circuit 52. As shown in FIG. 5A, the switch control signal CTRL controls a state of the switch 63. When the switch control signal CTRL indicates that a FET switch (for example, the DFET switch 23 of FIG. 3) should be turned on, the switch 63 is opened and a current of the first current source 61 biases the FET source follower circuit 52. However, when the switch control signal CTRL indicates that the FET switch should be turned off, the switch 63 is closed and a sum of a current of the first current source 61 and a current of the second current source 62 biases the FET source follower circuit 52.

Since the current of the voltage shifting circuit 53 flows through the impedance 55, the bias voltage $V_{BIAS}$ changes with the state of the switch control signal CTRL. Thus, an amount of voltage shift provided by the voltage shifting circuit 53 depends on a state of the switch control signal CTRL.

The illustrated voltage shifting circuit 53 provides voltage shifting based on controlling the bias current of the FET source follower circuit 52. However, other implementations of voltage shifting are possible.

Additional details of the adaptive biasing circuit 50 can be similar to those described earlier.

Figure 5B:
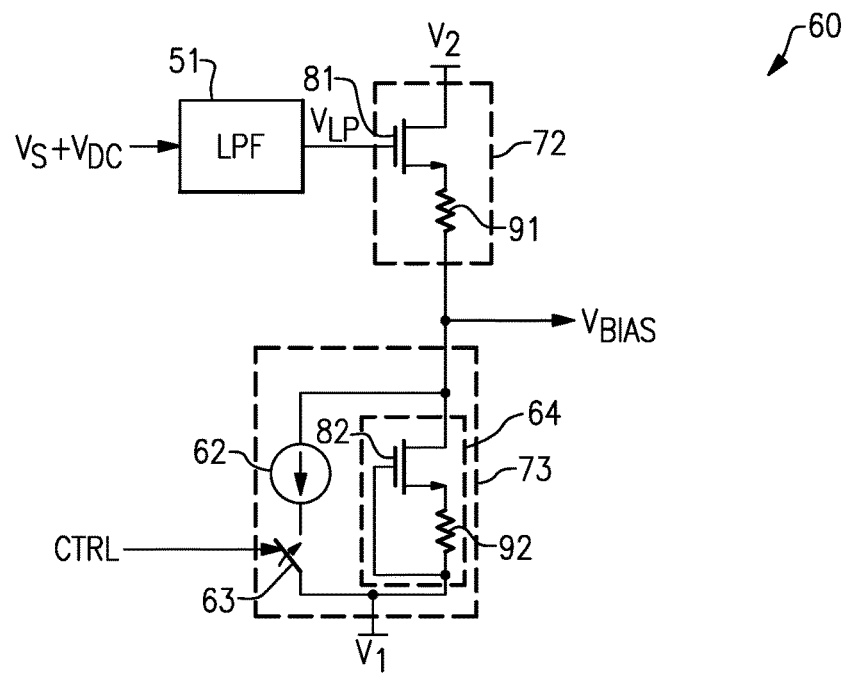
FIG. 5B is an adaptive biasing circuit according to another embodiment.

FIG. 5B is an adaptive biasing circuit 60 according to another embodiment. The adaptive biasing circuit 60 includes a low pass filter 51, a DFET source follower circuit 72, and a voltage shifting circuit 73. The DFET source follower circuit 72 includes a first DFET 81 and first resistor 91. The voltage shifting circuit 73 includes a first current source 64 implemented using a second DFET 82 and a second resistor 92. The voltage shifting circuit 73 further includes a second current source 62 and a switch 63.

As shown in FIG. 5B, the low pass filter 51 receives a signal path voltage. The signal path voltage includes a DC voltage component $V_{DC}$ and an AC signal component $V_S$. The low pass filter 51 filters the signal path voltage to generate a low pass filtered voltage $V_{LP}$ for the gate of the first DFET 81. The first DFET 81 includes a drain electrically connected to the second voltage $V_2$ and a source electrically to a first end of the first resistor 91. Since the first DFET 81 is electrically connected in a source follower configuration, the source voltage of the first DFET 81 is about equal to gate voltage of the first DFET 81 minus the DFET's threshold voltage.

Since the first DFET 81 is a depletion mode transistor, the source voltage of the first DFET 81 can be greater than or equal to that of the gate voltage. Using a depletion mode transistor increases voltage headroom and allows the bias voltage $V_{BIAS}$ to be controlled to be about equal to the low pass filtered voltage $V_{LP}$ when the switch control signal CTRL is enabled.

The illustrated voltage shifting circuit 73 controls a bias current of the DFET source follower circuit 72. When the switch control signal CTRL is enabled, the switch 63 is opened and a current generated by the first current source 64 biases the DFET source follower circuit 72. However, when the switch control signal CTRL is disabled, the switch 63 is closed and the voltage shifting circuit 73 biases the DFET source follower circuit 72 with a bias current corresponding to a sum of a current of the first current source 64 and a current of the second current source 62.

In one embodiment, the first and second resistors 91, 92 each have a resistance R and the second DFET 82 is implemented as a replica or copy of the first DFET 81. In such a configuration, the bias voltage $V_{BIAS}$ is about equal to the low pass filtered voltage $V_{LP}$ outputted by the low pass filter 51 when the switch control signal CTRL is in an enabled state. Additionally, the bias voltage $V_{BIAS}$ is about equal to the low pass filtered voltage $V_{LP}$ minus a shift voltage $V_{SHIFT}$ when the switch control signal CTRL is in an disabled state. The shift voltage $V_{SHIFT}$ is about equal to $I_2*R$, where $I_2$ is the current generated by the second current source 62.

Additional details of the adaptive biasing circuit 60 can be similar to those described earlier.

FIG. 6A is an annotated circuit diagram 100 at low frequency for one embodiment of an RF switching circuit. The annotated circuit diagram 100 includes a first terminal 21, a second terminal 22, a first DFET switch 23a, a second DFET switch 23b, a third DFET switch 23c, a first gate resistor 25a, a second gate resistor 25b, a third gate resistor 25c, a first adaptive biasing circuit 101, a second adaptive biasing circuit 102, and a voltage divider 104. In the illustrated embodiment, the switch control signal CTRL is provided to the first and second adaptive biasing circuits 101, 102, and is used to selectively open or close the RF switching circuit, thereby controlling the impedance between the first terminal 21 and the second terminal 22.

As shown in FIG. 6A, the first terminal 21 has been annotated to receive a voltage corresponding to a sum of a first signal voltage $V_{S1}$ and a first DC voltage $V_{DC1}$. In the illustrated example, the first signal voltage $V_{S1}$ is of low frequency. Additionally, the first adaptive biasing circuit 101 generates a first bias voltage that changes based on a state of the switch control signal CTRL. In particular, when the switch control signal CTRL indicates that the RF switching circuit should be turned on, the first adaptive biasing circuit 101 controls the first bias voltage to about equal to $V_{S1}+V_{DC1}$. Additionally, when the switch control signal CTRL indicates that the RF switching circuit should be turned off, the first adaptive biasing circuit 101 controls the first bias voltage to be about equal to $V_{S1}+V_{DC1}-V_{SHIFT}$.

Additionally, the second terminal 22 has been annotated to receive a voltage corresponding to a sum of a second signal voltage $V_{S2}$ and a second DC voltage $V_{DC2}$. In the illustrated example, the second signal voltage $V_{S2}$ is of low frequency. Additionally, the second adaptive biasing circuit 102 generates a second bias voltage that changes based on a state of the switch control signal CTRL. In particular, when the switch control signal CTRL indicates that the RF switching circuit should be turned on, the second adaptive biasing circuit 102 controls the second bias voltage to about equal to $V_{S2}+V_{DC2}$. Additionally, when the switch control signal CTRL indicates that the RF switching circuit should be turned off, the second adaptive biasing circuit 102 controls the second bias voltage to be about equal to $V_{S2}+V_{DC2}-V_{SHIFT}$.

The first and second adaptive biasing circuits 101, 102 can be implemented in accordance with the teachings herein. In one example, the first and second adaptive biasing circuits 101, 102 are each implemented using the configuration shown in FIG. 3. In another example, the adaptive biasing circuits 101-103 are each implemented using the configuration shown in FIG. 5A or 5B. Although the illustrated adaptive biasing circuits 101, 102 operate using the same shift voltage $V_{SHIFT}$, the teachings herein are also applicable to configurations in which the adaptive biasing circuits provide different shift voltages.

In certain implementations, the first and second signal voltages $V_{S1}$, $V_{S2}$ are about equal when the RF switching circuit is turned on, but can be different when the RF switching circuit is turned off. The first and second DC voltages $V_{DC1}$, $V_{DC2}$ can be the same or different, depending on implementation and/or application. For example, the teachings herein are applicable to a wide variety of switch configurations, including, for example, AC coupled switches, DC coupled switches with high output impedance, and DC coupled switches with low output impedance.

The illustrated voltage divider 104 receives the first bias voltage from the first adaptive biasing circuit 101 and the second bias voltage from the second adaptive biasing circuit 102. Additionally, the voltage divider 104 includes a first resistor 105a, a second resistor 105b, a third resistor 105c, and a fourth resistor 105d arranged to control biasing of the DFET switches 23a-23c. By including a voltage divider, such as the voltage divider 104, the DC voltages of the DFET switches 23a-23c can be controlled to different DC voltages of appropriate levels.

In one non-limiting example, the first DC voltage $V_{DC1}$ is about 0 V, the second DC voltage $V_{DC2}$ is about 1 V, and each of the resistors 105a-105d has about the same resistance. In such an example, the gates of the DFET switches 23a-23c are biased with DC voltages of about 250 mV, about 500 mV, and about 750 mV, respectively. Thus, a voltage divider can be used to incrementally distribute a DC voltage difference between a pair of terminals across multiple FET switches, thereby helping to maintain proper biasing during operation.

Accordingly, a voltage divider can be used to divide a DC voltage across the gates of multiple FET switches, such as the DFET switches 23a-23c. Although a configuration using three DFET switches is shown, other configurations are possible, such as implementations using more or fewer FET switches or a different arrangement of FET switches. Additionally, although a particular implementation of a voltage divider is shown, a voltage divider can be implemented in other ways.

The first and second adaptive biasing circuits 101, 102 serve to bias the DFET switches 23a-23c with appropriate DC bias voltages that change with the DC bias voltages of the first and second terminals 21, 22. Additionally, the first and second adaptive biasing circuits 101, 102 generate bias voltages that include a low frequency signal component of the first and second terminals 21, 22, respectively. Biasing the DFET switches 23a-23c in this manner increases low frequency power handling capability.

FIG. 6B is an annotated circuit diagram 110 at high frequency for one embodiment of an RF switching circuit. The annotated circuit diagram 110 includes the first terminal 21, the second terminal 22, the first DFET switch 23a, the second DFET switch 23b, the third DFET switch 23c, the first gate resistor 25a, the second gate resistor 25b, the third gate resistor 25c, the first adaptive biasing circuit 101, the second adaptive biasing circuit 102, and the voltage divider 104, which can be as described above with respect to FIG. 6A.

As shown in FIG. 6B, the first terminal 21 has been annotated to receive a voltage corresponding to a sum of a first signal voltage $V_{S1}$ and a first DC voltage $V_{DC1}$. In the illustrated example, the first signal voltage $V_{S1}$ is of high frequency, and thus is filtered by the first adaptive biasing circuit's low pass filter. Accordingly, when the switch control signal CTRL indicates that the RF switching circuit should be turned on, the first adaptive biasing circuit 101 controls the first bias voltage to about equal to $V_{DC1}$. Additionally, when the switch control signal CTRL indicates that the RF switching circuit should be turned off, the first adaptive biasing circuit 101 controls the first bias voltage to be about equal to $V_{DC1}-V_{SHIFT}$.

Additionally, the second terminal 22 has been annotated to receive a voltage corresponding to a sum of a second signal voltage $V_{S2}$ and a second DC voltage $V_{DC2}$. In the illustrated example, the second signal voltage $V_{S2}$ is of high frequency, and thus is filtered by the second adaptive biasing circuit's low pass filter. Accordingly, when the switch control signal CTRL indicates that the RF switching circuit should be turned on, the second adaptive biasing circuit 102 controls the second bias voltage to about equal to $V_{DC2}$. Additionally, when the switch control signal CTRL indicates that the RF switching circuit should be turned off, the second adaptive biasing circuit 102 controls the second bias voltage to be about equal to $V_{DC2}-V_{SHIFT}$.

Thus, when operating with high frequency signals at the first and second terminals 21, 22, the first and second adaptive biasing circuits 101, 102 bias the DFET switches 23a-23c with DC voltages. However, high frequency components of the signal voltages $V_{S1}$, $V_{S2}$ couple onto the gate of the DFET switches 23a-23c via parasitic gate-to-drain and/or gate-to-source capacitances. Thus, the gate voltages of the DFET switches 23a-23c track the signal voltages $V_{S1}$, $V_{S2}$.

In particular, the illustrated first to third DFET switches 23a-23c have been annotated to include first to third parasitic gate-to-source capacitors 27a-27c, respectively, and first to third parasitic gate-to-drain capacitors 28a-28c, respectively. The parasitic capacitors operate to couple the high frequency signal voltages $V_{S1}$, $V_{S2}$ onto the gates of the DFET switches 23a-23c.

With reference to FIGS. 6A and 6B, the illustrated RF switching circuit exhibits excellent power handling capability, including both at low frequencies and at high frequencies. In particular, the adaptive biasing circuits 101, 102 generate first and second bias voltages that track low frequency signal components of the first and second terminals 21, 22. Additionally, high frequency components of the first and second terminals 21, 22 couple onto the DFET switches' gates via parasitic capacitances. Thus, the gate voltages of the DFET switches 23a-23c track signal components across a wide range of frequencies, which in turn results in excellent power handling capability over a wide frequency range.

Additional details of the RF switching circuit of FIGS. 6A and 6B can be similar to those described earlier.

Figure 7:
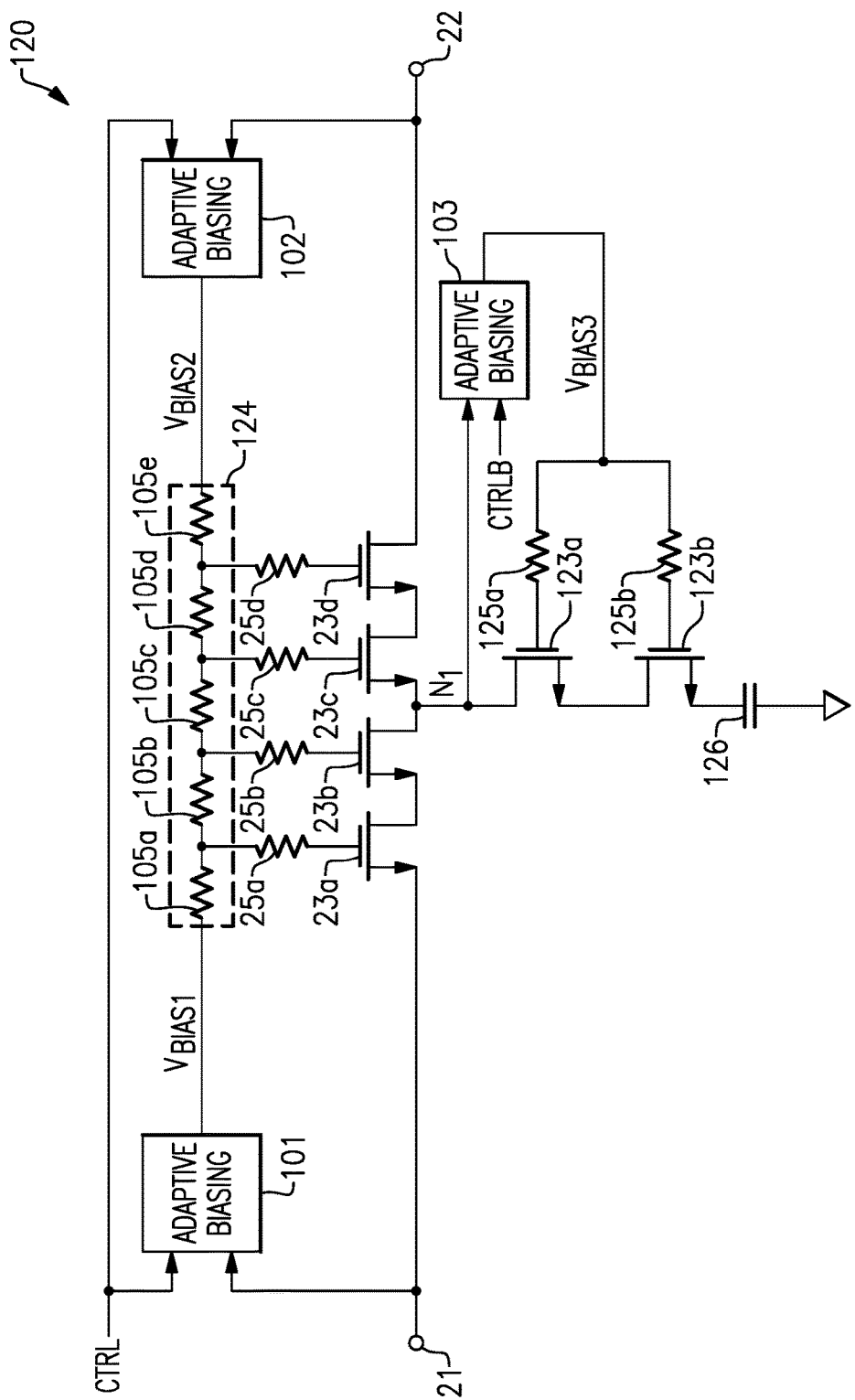
FIG. 7 is a circuit diagram of an RF switching circuit according to another embodiment.

FIG. 7 is a circuit diagram of an RF switching circuit 120 according to another embodiment. The RF switching circuit 120 includes a first terminal 21, a second terminal 22, a first series DFET switch 23a, a second series DFET switch 23b, a third series DFET switch 23c, a fourth series DFET switch 23d, a first group of gate resistors 25a-25d, a first shunt DFET switch 123a, a second shunt DFET switch 123b, a second group of gate resistors 125a-125b, a DC blocking capacitor 126, a first adaptive biasing circuit 101, a second adaptive biasing circuit 102, a third adaptive biasing circuit 103, and a voltage divider 124.

As shown in FIG. 7, the first to fourth series DFET switches 23a-23d are electrically connected in series between the first terminal 21 and the second terminal 22. Additionally, a switch control signal CTRL is provided to the first and second adaptive biasing circuits 101, 102. The switch control signal CTRL is used to turn on or off the RF switching circuit 120, thereby controlling the impedance between the first terminal 21 and the second terminal 22.

The first adaptive biasing circuit 101 generates a first bias voltage $V_{BIAS1}$ that includes a low frequency signal component of the first terminal 21. Additionally, the second adaptive biasing circuit 102 generates a second bias voltage $V_{BIAS2}$ that includes a low frequency signal component of the second terminal 22. The illustrated voltage divider 124 includes first to fifth resistors 105a-105e, respectively. The voltage divider 124 generates bias voltages for the gates of the series DFET switches 23a-23d based on dividing the voltage difference between the first bias voltage $V_{BIAS1}$ and the second bias voltage $V_{BIAS2}$. As shown in FIG. 7, the voltage divider 124 provides bias voltages to the gates of the series DFET switches 23a-23d via the first group of gate resistors 25a-25d. Although a configuration using four series DFET switches is shown, other configurations are possible, such as implementations using more or fewer FET switches or a different arrangement of FET switches. Additionally, although a particular implementation of a voltage divider is shown, a voltage divider can be implemented in other ways.

The first and second adaptive biasing circuits 101, 102 serve to bias the series DFET switches 23a-23d with appropriate DC bias voltages that change with the DC bias voltages of the first and second terminals 21, 22. Additionally, the first and second adaptive biasing circuits 101, 102 generate bias voltages $V_{BIAS1}$, $V_{BIAS2}$ that include a low frequency signal component of the first and second terminals 21, 22, respectively. Biasing the series DFET switches 23a-23d in this manner increases low frequency power handling capability.

The illustrated RF switching circuit 120 also includes the first and second shunt DFET switches 123a, 123b, which are electrically connected in series with the DC blocking capacitor 126 between a signal path node $N_1$ and a DC voltage, such as ground. In the illustrated embodiment, the signal path node $N_1$ is between the second and third series DFET switches 23b, 23c. However, other implementations are possible.

The first and second shunt DFET switches 123a, 123b are connected in shunt with respect to the signal path between the first and second terminals 21, 22. Although a configuration using two shunt DFET switches is shown, other configurations are possible, such as implementations using more or fewer FET switches or a different arrangement of FET switches.

The illustrated RF switching circuit 120 includes the DC blocking capacitor 126. Including the DC blocking capacitor 126 reduces static power dissipation by preventing a flow of DC current. However, other implementations are possible.

The third adaptive biasing circuit 103 generates a third bias voltage $V_{BIAS3}$ that includes a low frequency signal component of the signal path node $N_1$. The third bias voltage $V_{BIAS3}$ is used to bias the gates of the first and second shunt DFET switches 123a, 123b via the second group of gate resistors 125a, 125b. Biasing the shunt DFET switches 123a, 123b in this manner increases power handling capability.

As shown in FIG. 7, the first and second adaptive biasing circuits 101, 102 receive the switch control signal CTRL, and the third adaptive biasing circuit 103 receives the inverted switch control signal CTRLB. Implementing the RF switching circuit 120 in this way opens and closes the series DFET switches 23a-23d and the shunt DFET switches 123a-123b in a complementary manner. For example, when the series DFET switches 23a-23d are turned on, the shunt DFET switches 123a-123b are turned off, and vice-versa. Including both series switches and shunt switches provides the RF switching circuit 120 with high isolation in the OFF state.

The adaptive biasing circuits 101-103 can be implemented in accordance with the teachings herein. In one example, the adaptive biasing circuits 101-103 are each implemented using the configuration shown in FIG. 3. In another example, the adaptive biasing circuits 101-103 are each implemented using the configuration shown in FIG. 5A or 5B.

Additional details of the RF switching circuit 120 can be similar to those described earlier.

Figure 8:
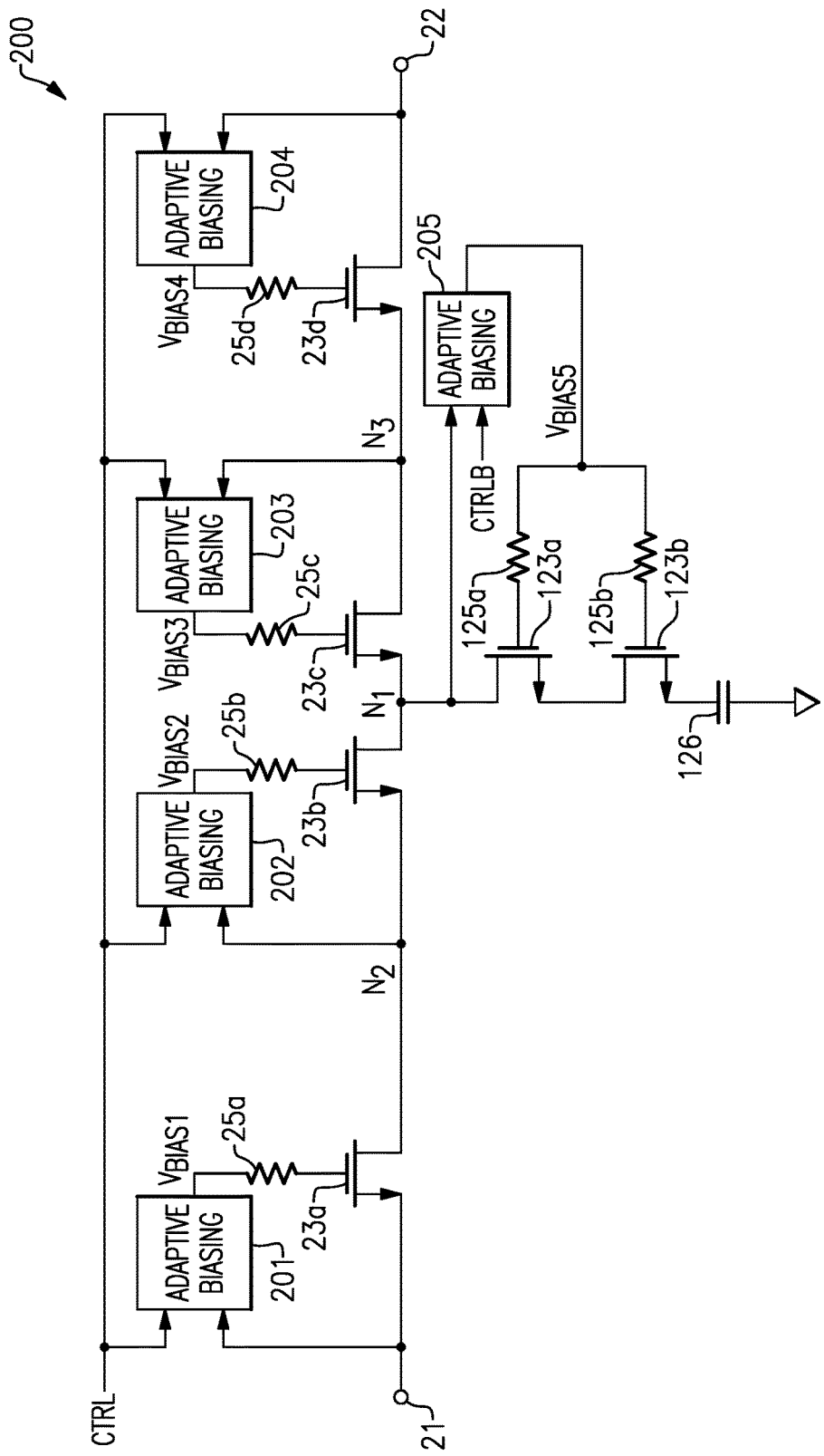
FIG. 8 is a circuit diagram of an RF switching circuit according to another embodiment.

FIG. 8 is a circuit diagram of an RF switching circuit 200 according to another embodiment. The RF switching circuit 200 includes a first terminal 21, a second terminal 22, a first series DFET switch 23a, a second series DFET switch 23b, a third series DFET switch 23c, a fourth series DFET switch 23d, a first group of gate resistors 25a-25d, a first shunt DFET switch 123a, a second shunt DFET switch 123b, a second group of gate resistors 125a-125b, a DC blocking capacitor 126, a first adaptive biasing circuit 201, a second adaptive biasing circuit 202, a third adaptive biasing circuit 203, a fourth adaptive biasing circuit 204, and a fifth adaptive biasing circuit 205.

The RF switching circuit 200 of FIG. 8 is similar to the RF switch circuit 120 of FIG. 7, except that the RF switching circuit 200 of FIG. 8 includes a different implementation of adaptive biasing. In particular, rather than using the adaptive biasing circuits 101-103 and voltage divider 124 of FIG. 7, the RF switching circuit 200 of FIG. 8 includes the adaptive biasing circuits 201-205.

As shown in FIG. 8, the first adaptive biasing circuit 201 generates a first bias voltage $V_{BIAS1}$ for the first series DFET switch 23a. The first bias voltage $V_{BIAS1}$ includes a low frequency signal component of the first terminal 21. Additionally, the second adaptive biasing circuit 202 generates a second bias voltage $V_{BIAS2}$ for the second series DFET switch 23b. The second bias voltage $V_{BIAS2}$ includes a low frequency signal component of the signal path node $N_2$, which is positioned between the first and second series DFET switches 23a, 23b. Furthermore, the third adaptive biasing circuit 203 generates a third bias voltage $V_{BIAS3}$ for the third series DFET switch 23c. The third bias voltage $V_{BIAS3}$ includes a low frequency signal component of the signal path node $N_3$, which is positioned between the third and fourth series DFET switches 23c, 23d. Additionally, the fourth adaptive biasing circuit 204 generates a fourth bias voltage $V_{BIAS4}$ for the fourth series DFET switch 23d. The fourth bias voltage $V_{BIAS4}$ includes a low frequency signal component of the second terminal 22. As shown in FIG. 8, the bias voltages $V_{BIAS1}$-$V_{BIAS4}$ are provided to the gates of the series DFET switches 23a-23d via the gate resistors 25a-25d, respectively.

Thus, the illustrated RF switching circuit 200 provides adaptive biasing to the series DFET switches 23a-23d using a separate adaptive biasing circuit for each series DFET switch. Additionally, the gate of each series DFET switch 23a-23d is provided with low frequency signal components of a different node along the signal path between the first and second terminals 21, 22.

The fifth adaptive biasing circuit 205 generates a fifth bias voltage $V_{BIAS5}$ for the first and second shunt DFET switches 123a, 123b. The fifth bias voltage $V_{BIAS5}$ includes a low frequency signal component of the signal path node $N_1$, which is positioned between the second and third series DFET switches 23b, 23c, in this example.

The adaptive biasing circuits 201-205 can be implemented in accordance with the teachings herein. In one example, the adaptive biasing circuits 201-205 are each implemented using the configuration shown in FIG. 3. In another example, adaptive biasing circuits 201-205 are each implemented using the configuration shown in FIG. 5A or FIG. 5B.

As shown in FIG. 8, the first to fourth adaptive biasing circuits 201-204 receive the switch control signal CTRL, and the fifth switch control signal 205 receives the inverted switch control signal CTRLB. Implementing the RF switching circuit 200 in this way opens and closes the series DFET switches 23a-23d and the shunt DFET switches 123a-123b in a complementary manner.

Although a specific embodiment of an RF switching circuit is shown, other configurations are possible, such as configurations using more or fewer FET switches, a different arrangement of FET switches, and/or a different implementation of adaptive biasing.

Additional details of the RF switching circuit 200 can be similar to those described earlier.

Figure 9:
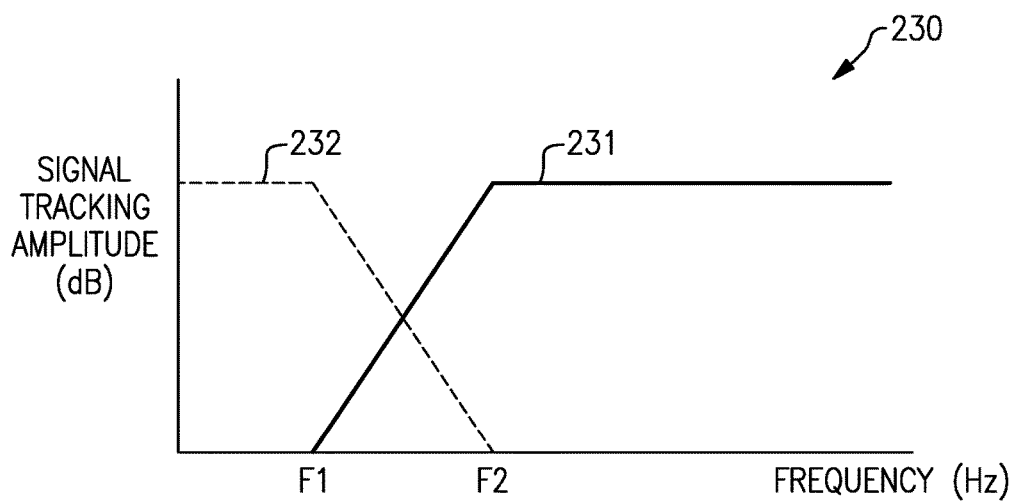
FIG. 9 is a graph of frequency versus signal tracking amplitude according to one embodiment.

FIG. 9 is a graph 230 of frequency versus signal tracking amplitude for one implementation of the RF switching circuit 30 of FIG. 3. The graph 230 illustrates the amount of signal amplitude from the first terminal 21 that reaches the gate of the FET switch 23 versus signal frequency.

The graph 230 includes a first plot 231 of signal tracking amplitude associated with signal coupling to the gate via parasitic gate-to-drain and/or gate-to-source capacitances (for example, parasitic capacitors 27, 28 shown in FIG. 4B) of the FET switch 23. As shown in FIG. 9, the parasitic capacitances of the FET switch 23 can couple high frequency signal components of about a frequency F2 or higher onto the gate of the FET switch 23 with little to no attenuation. Thus, the FET switch 23 can exhibit robust power handling capabilities for high frequencies signals, since the FET switch's gate voltage can track or change with the signal to maintain proper biasing conditions. However, low frequency signal components can be attenuated or blocked by the FET switch's parasitic capacitances and not reach the gate of the FET switch 23.

The graph 230 further includes a second plot 232 of signal tracking tracking amplitude associated with the adaptive biasing circuit 24 providing a low frequency signal component to the gate of the FET switch 23. As shown in FIG. 9, the adaptive biasing circuit 24 has been implemented to generate a bias voltage that includes low frequency signal components of about a frequency F1 or lower. Thus, low frequency signal components are provided to the gate of the FET switch 23 via the adaptive biasing circuit 24.

By selecting the cutoff frequency of the low pass filter 31 of FIG. 3, the frequency response associated with the first plot 231 can be shifted to a desired location. In certain implementations, the cutoff frequency of the low pass filter 31 is selected such that the combined signal tracking amplitude from the adaptive biasing circuit and from signal coupling via parasitic capacitors is substantially constant versus frequency. Implementing an RF switching circuit in this manner provides robust signal tracking at the gate of the FET switch across a wide range of frequencies, including both at high frequencies and at low frequencies. Thus, the RF switching circuit exhibits excellent power handling capability over a wide frequency range.

In one embodiment, the cutoff frequency of the low pass filter 31 is selected to be in the range of about 100 kHz to about 10 MHz. Although one example range of cutoff frequencies has been provided, other cutoff frequencies can be used, such as a cutoff frequency associated with a particular manufacturing process and/or FET switch implementation. For example, the value of the first frequency F1 and/or second frequency F2 can be based on a settling time of FET switch, which in turn can be based on a value of the FET switch's gate resistor.

In one embodiment, the low pass filter 31 includes has a tunable or programmable cutoff frequency. For example, the low pass filter 31 can include a programmable capacitor and/or programmable resistor, thereby allowing the cutoff frequency of the low pass filter 31 to be tuned to control the amount of low frequency compensation provided by the adaptive biasing circuit 24. In one example, the cutoff frequency is controlled via data provided over one or more IC pins (for example, over a serial peripheral interface) and/or by data stored in a programmable memory determined during manufacture and testing. In another example, the low pass filter 31 has a cutoff frequency determined on-chip during a calibration cycle.

Figure 10:
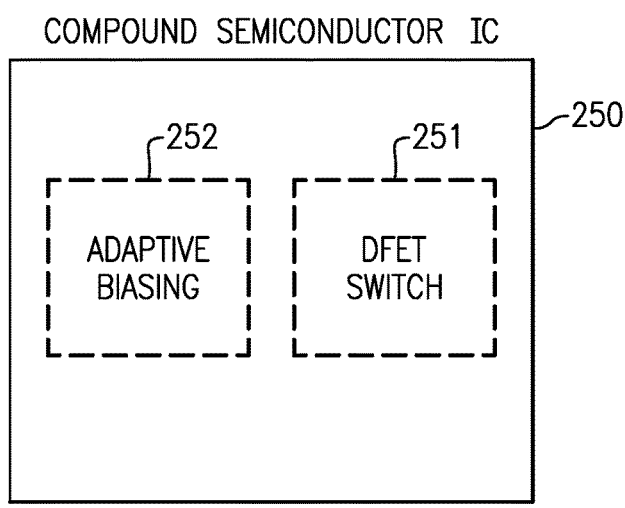
FIG. 10 is a schematic diagram of a compound semiconductor integrated circuit (IC) according to one embodiment.

FIG. 10 is a schematic diagram of a compound semiconductor IC 250 according to one embodiment. The compound semiconductor IC 250 includes a DFET switch 251 and an adaptive biasing circuit 252.

To achieve high performance, a FET switch can be manufactured using compound semiconductor technology. For example, FET switches fabricated using III-V processes can exhibit higher linearity, lower insertion loss, and/or superior maximum operating frequency relative to FET switches manufactured using certain Silicon processes, such as a bulk CMOS processes.

The illustrated embodiment includes the DFET switch 251 and the adaptive biasing circuit 252 implemented on a common die. The die is a compound semiconductor die, such as those fabricated using III-V processes, for instance, GaAs.

A compound semiconductor process can include a limited selection of available components that can be fabricated using the process. For instance, a particular compound semiconductor process may be specified to fabricate circuits that include FETs (for example, DFETs), resistors (for example, thin film resistors and/or mesa resistors), and/or capacitors (for example, metal-insulator-metal capacitors).

Certain biasing circuits may use components that are unavailable in a compound semiconductor process and/or can be implemented using unduly large or complex circuits, and thus such implementations can use multiple dies. For instance, such a switching system can be implemented using an MCM including a bulk CMOS biasing die and a GaAs switching die.

In contrast, the illustrated compound semiconductor IC 250 includes the DFET switch 251 and the adaptive biasing circuit 252 integrated on a common compound semiconductor chip. For example, the DFET switch 251 and the adaptive biasing circuit 252 can be implemented using resistor, capacitor, and FET components available in a compound semiconductor process. In one example, the adaptive biasing circuit 252 is implemented in the configuration shown in FIG. 5B, and includes a low pass filter implemented using a resistor and a capacitor, a DFET source follower circuit implemented using a DFET and a resistor, and a voltage shifting circuit implemented using DFETs and resistors.

Implementing the DFET switch 251 and the adaptive biasing circuit 252 on a common chip provides a more compact switch solution relative to a configuration implemented using separate chips.

The teachings herein can be used to provide a FET switch with robust power handling performance across a wide range of frequencies, including at a lower end of an operating frequency range. The FET switch can operate with robust power handling across a wide frequency range, while maintaining a relatively fast switching time performance. The FET switch can also exhibit low insertion loss and/or high linearity. The teachings herein can also be used to provide an integrated switching system, in which an adaptive biasing circuit and a FET switch are integrated on a single chip, such as a compound semiconductor IC.

In one embodiment, the adaptive biasing circuit 252 is implemented using the configuration shown in FIG. 5B, and the compound semiconductor IC 250 is a GaAs die.

Applications

Devices employing the above described RF switching circuits can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) switching circuit comprising:
   a field effect transistor (FET) switch electrically connected along a signal path; and
   an adaptive biasing circuit configured to generate a bias voltage, wherein a gate of the FET switch is biased in part by the bias voltage, the adaptive biasing circuit comprising:
   a low pass filter configured to generate a low pass filtered voltage based on low pass filtering a signal path voltage of a node of the signal path;
   a buffer circuit configured to receive the low pass filtered voltage and to generate a buffered voltage; and
   a voltage shifting circuit configured to generate the bias voltage by shifting the buffered voltage by an amount of voltage that changes based on a state of a switch control signal.

2. The RF switching circuit of claim 1, further comprising a gate resistor, wherein the gate of the FET switch receives the bias voltage via the gate resistor.

3. The RF switching circuit of claim 2, wherein a low frequency component of the signal path voltage is provided to the gate of the FET switch via the bias voltage.

4. The RF switching circuit of claim 3, wherein a high frequency component of the signal path voltage is provided to the gate of the FET switch via a parasitic capacitance of the FET switch.

5. The RF switching circuit of claim 1, wherein the buffer circuit comprises a FET source follower circuit.

6. The RF switching circuit of claim 5, wherein the voltage shifting circuit generates the bias voltage by controlling an amount of bias current of the FET source follower circuit based on the state of the switch control signal.

7. The RF switching circuit of claim 1, wherein the FET switch comprises a depletion mode field effect transistor (DFET) switch having a threshold voltage that is less than or equal to about 0 V.

8. The RF switching circuit of claim 7, wherein the buffer circuit comprises a first DFET and a first resistor, wherein a gate of the first DFET receives the low pass filtered voltage, and wherein a source of the first DFET is electrically connected to a first end of the first resistor.

9. The RF switching circuit of claim 8, wherein the voltage shifting circuit comprises a first current source comprising a second DFET and a second resistor, wherein a gate of the second DFET is electrically connected to a first voltage, wherein a source of the second DFET is electrically connected to the first voltage via the second resistor, and wherein a drain of the second DFET is electrically connected to a second end of the first resistor.

10. The RF switching circuit of claim 9, wherein the voltage shifting circuit further comprises a second current source and a switch electrically connected in series between the second end of the first resistor and the first voltage, wherein the switch is controlled based on the state of the switch control signal.

11. The RF switching circuit of claim 1, wherein the FET switch and the adaptive biasing circuit are integrated on a compound semiconductor die.

12. An electronically-implemented method of switch biasing, the method comprising:
   receiving a switch control signal and a voltage of a signal path as inputs to an adaptive biasing circuit;
   generating a low pass filtered voltage by low pass filtering the voltage of the signal path using the adaptive biasing circuit;
   generating a buffered voltage based on buffering the low pass filtered voltage using the adaptive biasing circuit;
   generating a bias voltage using the adaptive biasing circuit by shifting the buffered voltage by an amount of voltage that changes based on a state of the switch control signal; and
   controlling a gate voltage of a FET switch that is electrically connected along the signal path based in part on the bias voltage.

13. The method of claim 12, further comprising:
   providing a low frequency component of the voltage of the signal path to the gate of the FET switch via the bias voltage; and
   providing a low frequency component of the voltage of the signal path to the gate of the FET switch via a parasitic capacitance of the FET switch.

14. A radio frequency (RF) system comprising:
   one or more series field effect transistor (FET) switches electrically connected along a signal path between a first terminal and a second terminal; and
   a first adaptive biasing circuit configured to generate a first bias voltage, wherein a first series FET switch of the one or more series FET switches is biased in part by the first bias voltage, wherein the first adaptive biasing circuit comprises:
- a low pass filter configured to generate a low pass filtered voltage based on low pass filtering a voltage of the first terminal;
- a buffer circuit configured to receive the low pass filtered voltage and to generate a buffered voltage; and
- a voltage shifting circuit configured to generate the first bias voltage based on the buffered voltage and a state of a switch control signal.

15. The RF system of claim 14, wherein the one or more series FET switches comprises a plurality of series FET switches electrically connected in series between the first terminal and the second terminal.

16. The RF system of claim 15, further comprising a second adaptive biasing circuit configured to generate a second bias voltage that is based on a voltage of the second terminal, wherein a second series FET switch of the plurality of series FET switches is biased in part by the second bias voltage.

17. The RF system of claim 16, further comprising a voltage divider that receives the first bias voltage and the second bias voltage and generates a plurality of divided voltages that bias the plurality of series FET switches.

18. The RF system of claim 15, wherein the plurality of series FET switches are biased by a plurality of adaptive biasing circuits each connected to a different node along the signal path.

19. The RF system of claim 14, further comprising one or more shunt FET switches electrically connected in shunt to the signal path.

20. The RF system of claim 19, further comprising a second adaptive biasing circuit configured to generate a second bias voltage that is based on a voltage of a node of the signal path, wherein the one or more shunt FET switches are biased in part by the second bias voltage.

\* \* \* \* \*